(12) United States Patent
Fleskens et al.

(10) Patent No.: US 9,316,447 B2
(45) Date of Patent: Apr. 19, 2016

(54) THERMAL INTERFACE MATERIAL

(71) Applicants: Bas Fleskens, Eindhoven (NL); Reinier Imre Anton Den Boer, Eindhoven (NL)

(72) Inventors: Bas Fleskens, Eindhoven (NL); Reinier Imre Anton Den Boer, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/386,191

(22) PCT Filed: Mar. 11, 2013

(86) PCT No.: PCT/IB2013/051907
§ 371 (c)(1),
(2) Date: Sep. 18, 2014

(87) PCT Pub. No.: WO2013/140295
PCT Pub. Date: Sep. 26, 2013

(65) Prior Publication Data
US 2015/0036363 A1     Feb. 5, 2015

Related U.S. Application Data

(60) Provisional application No. 61/614,065, filed on Mar. 22, 2012.

(51) Int. Cl.
*H01L 23/42* (2006.01)
*F28F 3/00* (2006.01)
(Continued)

(52) U.S. Cl.
CPC . *F28F 3/00* (2013.01); *B29C 55/12* (2013.01); *F21V 29/22* (2013.01); *F28F 21/00* (2013.01);
(Continued)

(58) Field of Classification Search
CPC ............... H01L 23/42; H01L 23/3737; H01L 2924/0002; H01L 2924/00; F21V 29/22; B29C 55/12; F28F 3/00; B29K 2105/256; B29K 2105/0002; B29K 2101/12; B29L 2009/00; F21Y 2101/02
See application file for complete search history.

(56) References Cited

U.S. PATENT DOCUMENTS 5,591,034 A    1/1997 Ameen et al.
5,940,687 A    8/1999 Davis et al.
(Continued)

FOREIGN PATENT DOCUMENTS

DE    4041444 C1    11/1991
GB    1516913 A1    7/1978
(Continued)

OTHER PUBLICATIONS

"Product Performance", Powerstrate, Technical Data Sheet, Loctite, Henkel Technologies, Nov. 2002, pp. 1-2.

*Primary Examiner* — Bao Q Truong

(57) ABSTRACT

There is provided a thermal interface material, TIM, a thermal interface application comprising such a TIM, and corresponding methods for providing the material and the thermal interface. The TIM comprises a TIM layer in which an activable shrinkage material is distributed, such that upon activation of the shrinkage material the thickness of the TIM layer is increased. In the thermal interface application, where the TIM (400) is arranged between a heat generating component (20) and a heat conducting element (30), the increase in thickness of the TIM layer is utilized to increase the contact pressure on mating surfaces. The TIM is sandwiched between the heat generating component and the heat conducting element before the activation of the shrinkage material, and the distance (h) between the heat generating component and the heat conducting element is restricted such upon activation of the shrinkage material, the restricted maximum height (h) between the heat generating component and the heat conducting element in combination with the TIM increasing the thickness of the TIM layer, the contact pressure on the mating surfaces is increased.

16 Claims, 5 Drawing Sheets

(51) Int. Cl.
*H01L 23/373* (2006.01)
*B29C 55/12* (2006.01)
*F21V 29/00* (2015.01)
*F28F 21/00* (2006.01)
*B29K 101/12* (2006.01)
*B29K 105/00* (2006.01)
*B29L 9/00* (2006.01)
*F21Y 101/02* (2006.01)

(52) U.S. Cl.
CPC ............ *H01L 23/3737* (2013.01); *H01L 23/42* (2013.01); *B29K 2101/12* (2013.01); *B29K 2105/0002* (2013.01); *B29K 2105/256* (2013.01); *B29K 2995/0013* (2013.01); *B29L 2009/00* (2013.01); *F21Y 2101/02* (2013.01); *H01L 2924/0002* (2013.01); *Y10T 29/49366* (2015.01)

(56) References Cited

U.S. PATENT DOCUMENTS

| | | | |
|---|---|---|---|
| 6,653,741 B2 * | 11/2003 | Sreeram et al. | 257/781 |
| 6,746,768 B2 | 6/2004 | Greinke et al. | |
| 6,761,813 B2 * | 7/2004 | Xu | 205/114 |
| 7,229,683 B2 * | 6/2007 | Fischer et al. | 428/293.7 |
| 7,252,877 B2 * | 8/2007 | Jayaraman et al. | 428/323 |
| 2005/0121775 A1 | 6/2005 | Fitzgerald | |

FOREIGN PATENT DOCUMENTS

| | | |
|---|---|---|
| JP | 200220501 | 1/2002 |
| JP | 200632626 A | 2/2006 |
| JP | 2006086246 A | 3/2006 |
| WO | 03024724 A3 | 3/2003 |

\* cited by examiner

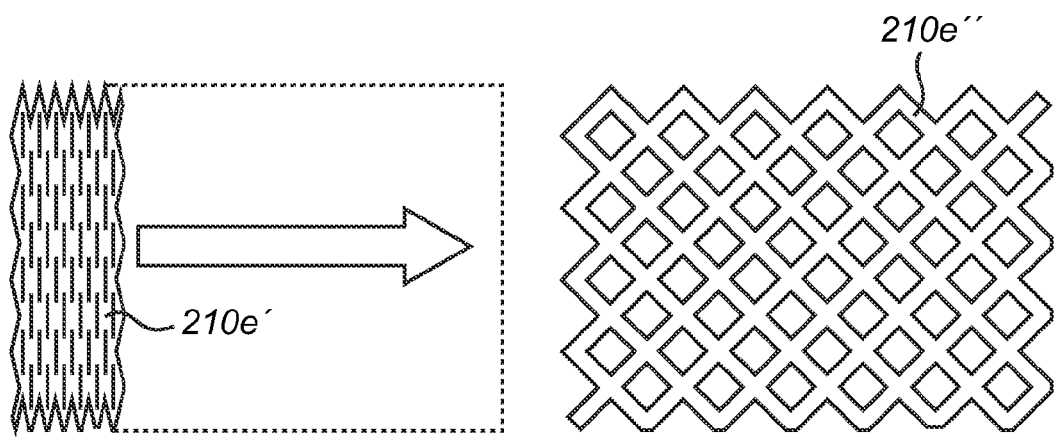
*Fig. 2g*
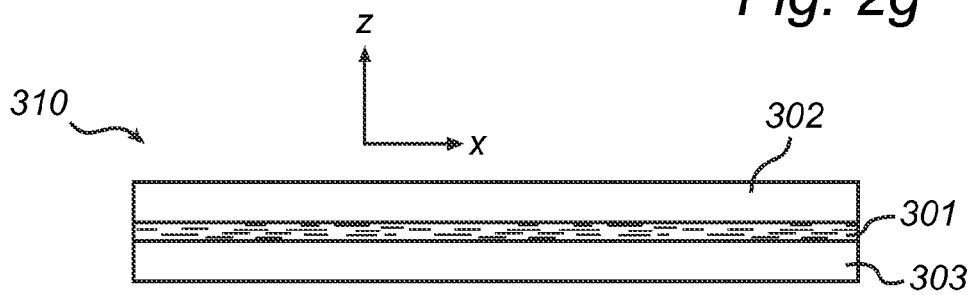
*Fig. 3a*
*Fig. 3b*
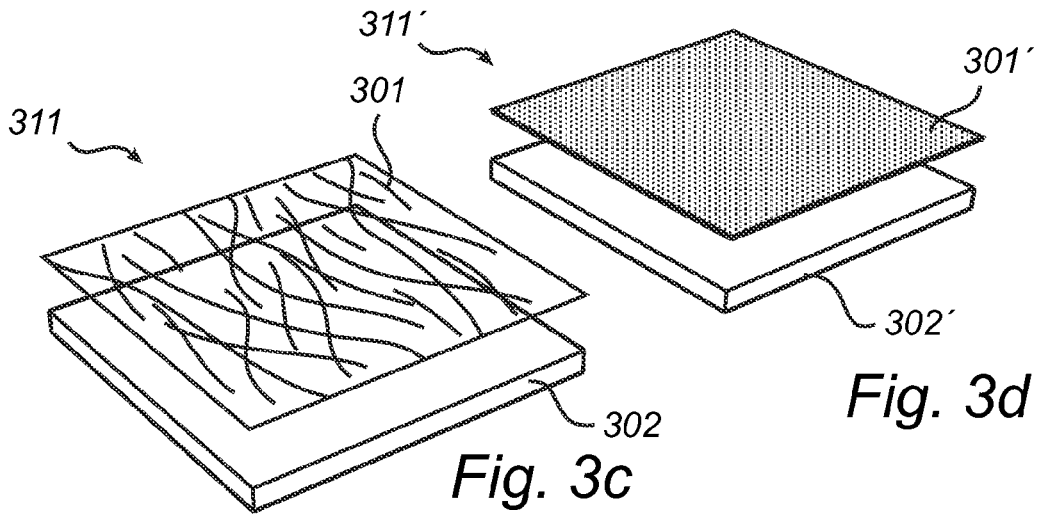
*Fig. 3c*
*Fig. 3d*

THERMAL INTERFACE MATERIAL

CROSS-REFERENCE TO PRIOR APPLICATIONS

This application is the U.S. National Phase application under 35 U.S.C. §371 of International Application No. PCT/IB13/051907, filed on Mar. 11, 2013, which claims the benefit of U.S. Provisional Patent Application No. 61/614,065, filed on Mar. 22, 2012. These applications are hereby incorporated by reference herein.

TECHNICAL FIELD

The present invention relates to the field of thermal interface materials for thermal management of heat generating components, and more particularly to a thermal interface material according to the preamble of the independent claim.

BACKGROUND OF THE INVENTION

Thermal Interface Materials (TIMs) are thermally conductive materials typically designed to act as a thermal interface between a heat generating component, e.g. an electrical component, and a heat conducting element, e.g. a heat sink or a heat spreader, and to fill any voids or irregularities that may exist in the mating surfaces of the heat generating component and the heat conducting element. The latter increases the contact area between the heat generating component and the heat sink, thereby effectively reducing the thermal impedance between them and allowing for the efficient transfer of heat. To be effective, TIMs preferably have very low bulk thermal resistivity and a viscosity low enough to allow them to flow away from points of contact towards any voids that may exist between the mating surfaces. The TIM must also stay in place once it flows, and remain flexible during temperature changes. If the viscosity is too low, the TIM may flow out from between the mating surfaces leaving voids and resulting in higher thermal impedance.

There are a number of TIMs used on the market, like thermal paste, or grease, phase changing materials, thermal pads etc. The most important function of a TIM is to guarantee maximized physical contact between two interfaces, i.e. the mating surfaces of the heat generating component and the heat conductive element. Only when this function is fulfilled, the bulk conductivity of the TIM comes into play. Without proper physical contact with both interfaces, the bulk conductivity has a minor influence on the thermal resistance. It is for this reason that thermal paste or grease is usually a best performer thermally, despite its (in general) relatively low bulk conductivity: paste is structured in a way that it has extremely good wetting capabilities and thus establishes maximal physical contact between the interfaces. Phase change materials, PCMs, are engineered to show similar behavior. Also in the design of thermal pad materials, great care is taken to allow for maximal physical contact. The main driver behind the use of thermal gels and gap fillers is also based on maximal physical contact with both interfaces. For all these TIMs there is a certain contact pressure dependence of the thermal performance of the interface, which is generally strongest for the thermal pad materials: the higher the pressure, the better the physical contact (larger total contact area). Finally, there are thermal glues around that overcome the above mentioned issues but also have specific disadvantages of themselves, as will be described in the next section.

As the TIM generally requires a minimum contact pressure to ensure physical contact and thus optimal thermal performance, this complicates system designs in the sense that the system has to guarantee such a minimum pressure over lifetime. The before mentioned contact pressure requirement for optimal thermal performance has a number of disadvantages. First of all, a system that makes use of a TIM must be designed carefully with respect to the specified or required minimum contact pressure between the interfaces that hold the TIM. Features to realize the contact pressure can be screws, clamps, etc. which increases the cost of the system. Further, mounting with a predetermined pressure on the TIM surfaces is difficult, especially when utilizing plastic components or components having a certain tolerance. The externally applied pressure must be applied carefully. Too much geometric non-uniformity in the applied pressure can cause the interfaces to change shape (e.g. warp, curl, etc.). With that comes a fair risk that physical contact between the TIM and both interfaces is (partially) lost, and thus such an applied contact pressure is counter-acting the thermal performance, since establishing physical contact is the most important function of a TIM as explained above. Additionally, the contact pressure itself can cause the TIM to pump-out under thermal cycling by switching the device on and off (normal usage). This effect has been observed many times, especially in case of thermal pastes and PCMs, where the TIM subsequently contaminates other critical parts of the system. Furthermore, a TIMs thickness and hardness should be chosen carefully with respect to the properties or characteristics of both interfacial surfaces, such as roughness and curvature. This means that the selected TIM should be able to overcome the specified surface properties. Finally, thermal glue generally overcomes all these issues. However, glue has a huge disadvantage of itself, being risks of cracking and delaminating under thermal cycling induced by (often inherent) Coefficient of Thermal Expansion (CTE) mismatches, especially for larger surface areas. Moreover, glue always needs some kind of curing process which complicates the assembly process and increases production cost significantly.

SUMMARY OF THE INVENTION

In view of the above, an object of the invention is to provide an alternative and improved TIM material and TIM thermal interface application, and to at least alleviate the problems discussed above. This object is achieved by a TIM according to the present invention as defined in claim 1.

Thus, in accordance with an aspect of the present invention, there is provided a thermal interface material, TIM, comprising: a TIM layer which comprises an activable shrinkage material. The shrinkage material is distributed in the TIM layer such that upon activation of the shrinkage material the thickness of the TIM layer is increased, which advantageously provides an improved TIM material in which the physical dimensions are at least partly controllable. As the TIM layer has an extension in the x- and y-direction that is much larger than in the z-direction, the shrinkage behavior of the shrinkage material, being for instance fibers of a heat shrink material randomly distributed in the TIM layer, has a dominant effect in the xy-direction due to the relatively small dimension in the z-direction dimension of the TIM application. Equal shrinkage in all directions will give the largest dimensions, in the xy-direction, the largest relative material displacement, thereby pulling material from the TIM matrix along the way, thus resulting in an increase of the TIM dimension in z direction. Preferably, the shrinkage of the TIM in the xy-direction should be a factor 5-10 times larger than in the z-direction to provide an effective increase in the thickness of the TIM.

The increase in height upon activation of the shrinkage material can advantageously be utilized in a thermal interface. Thus, the TIM according to the present invention is applied between a heat generating component and a heat conducting element, e.g. a light emitting diode, LED, on a circuit board, and a heat sink or heat spreader. The activation of the shrinkage material of the TIM, e.g. by the heat from the LED itself or by an external heat source, then causes expansion in height of the TIM. Further, by restricting the separation in the z-direction between the LED and the heat sink, the resulting confined space in the z-direction for the TIM, the expansion in the z-direction of the TIM increases the contact pressure and thus the physical contact with both interfaces of the LED and the heat sink. Thereby, the need for, as in the prior art, in other ways providing a minimum externally provided contact pressure over lifetime between the LED and the heat sink/heat spreader, e.g. by means of clamping to guarantee a minimum contact pressure over lifetime, is therewith removed. This strongly alleviates the system design with respect to the contact pressure and potentially provides a huge cost saving on both "bill of materials", BOM, and assembly of the system, since now both interfaces only have to be kept in place and the TIM itself will take care of the physical contact.

Additionally, the thermal interface according to the present invention further advantageously corrects for any surface curvature and roughness properties of the mating interfaces and will thus be much more robust in usage than other TIMs on the market today. The type of TIM as provided by the present invention therefore has the potential to replace a very large amount of TIMs used today in any system, apparatus or industry.

According to an embodiment of the TIM, the shrinkage material is provided in a predetermined oriented direction within the TIM. The oriented direction may be selected to be one of a single direction, multiple directions, a radial direction, a mesh, etc. The shrinkage material can further comprise oriented fibers or randomly oriented fibers within a selected plane etc. Preferably, the orientation of the shrinkage material is selected to further facilitate the increase of the thickness of the TIM layer, and to facilitate the effect of the improved surface contact at a location where heat dissipation is most needed.

According to an embodiment of the TIM, the oriented direction is selected within the TIM layer xy-plane, which is effective to further increase the shrinkage in the xy-direction of the TIM layer, thereby increasing the overall thickness of the TIM.

According to an embodiment of the TIM, the TIM layer is a multilayer TIM comprising alternate TIM sub layers and shrinkage material layers. The multilayer TIM is advantageous for instance in that it allows different TIM sub layers to have direct bonding or friction with at least one layer of shrinkage material, which effectively forces the TIM sub layers to adapt to the shrinkage material when it is activated, i.e. to retract material in the xy-dimension. Multilayer TIMs may be manufactured e.g. by means of laminating the different layers, which provides an easy and low cost way to assemble two different materials together to form one sheet material.

According to an embodiment of the TIM, the shrinkage material comprises monomers, and the activation of the shrinkage material causes the monomers to polymerize. As the monomers bond together during polymerization, the density of the shrinkage material increases which causes the volume of the shrinkage material to shrink. By mixing the monomers and the TIM material before polymerization, and selecting monomers that form polymer crosslink systems this may advantageously provide sufficient passage channels for the TIM material to guide heat through the TIM (in contrary to for instance applying a laminate heat shrinkage material which may cause an obstruction of the thermal path by a closed or open surface with less thermal conductive properties). The use of monomers/polymer netting, additionally enables other activation methods than heat, e.g. UV radiation or other chemical reactions.

According to an embodiment of the TIM, the shrinkage material is an expanded polymer matrix, and the activation of the shrinkage material causes the expanded polymer matrix to relax back to an un-expanded state. Here the shrinkage of the shrinkage material is thus expansion based. This is applicable for instance in that the polymer matrix may be prefabricated, and optionally expanded, in an external process before adding it to the TIM layer, or as part of a multilayer TIM before applying it between TIM sub layers. In addition this will allow cutting/shaping of the heat shrinkage material in specific shapes in order to influence the shrinkage behaviors in shrinkage directions and strength relatively to the TIM material. The cutting/shaping of the heat shrinkage material may include die cutting and/or perforation in repetitive or oriented patterns of a foil of heat shrinkage material.

According to a third aspect of the invention there is provided a method for providing a Thermal Interface Material, TIM, comprising: providing a TIM layer, providing in the TIM layer an activable shrinkage material, optionally orienting the shrinkage material in an oriented direction, wherein upon activation of the shrinkage material the thickness of the TIM layer is increased.

According to an embodiment of the method, the shrinkage material is a monomer based material, wherein the activation of the shrinkage material causes the monomers to polymerize.

According to embodiments of the TIM, the thermal interface and their corresponding methods, the shrinkage material is preferably heat activated. This is advantageous in that the heat generating component itself can be utilized to provide the activation of the shrinkage material. Further, there is a number of commercially available heat activated shrinkage materials, which are well documented and suitable for use in a TIM.

According to an embodiment of the method, the shrinkage material is a polymer matrix and wherein the step or orienting the shrinkage material comprises: (optionally heating the polymer matrix,) mechanically stretching the polymer matrix in a direction corresponding to the TIM layer xy-plane, and subsequently locking (for instance by rapidly cooling) the stretched polymer matrix, thereby providing an expanded polymer matrix.

According to an embodiment of the method, the steps of providing a TIM layer, and providing an activable shrinkage material in the TIM layer, further comprises providing a multilayer TIM by means of alternate stacking of at least one TIM sub layer and at least one shrinkage material layer.

Further, as previously mentioned and according to a fourth aspect of the invention, a thermal interface is provided by providing a TIM according to the invention, and further arranging the TIM between a heat generating component and a heat conducting substrate. The distance between the heat generating component and the heat conducting substrate is restricted. The method to provide a thermal interface may further comprise activating the heat shrinkage material, for instance by exposing the TIM for heat, or some other activation which is applicable for the specific shrinkage material used in the TIM.

Other objectives, features and advantages will appear from the following detailed disclosure, from the attached dependent claims as well as from the drawings.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION OF PREFERRED EMBODIMENTS

Exemplifying embodiments of the thermal interface material, TIM, and its corresponding thermal interface application, methods on how to produce such TIM and thermal interface will now be described herein under.

The steps of the methods are described as a continuous sequence, however some of the steps may be performed in another order or some additional process step may be interleaved.

Figure 1A:
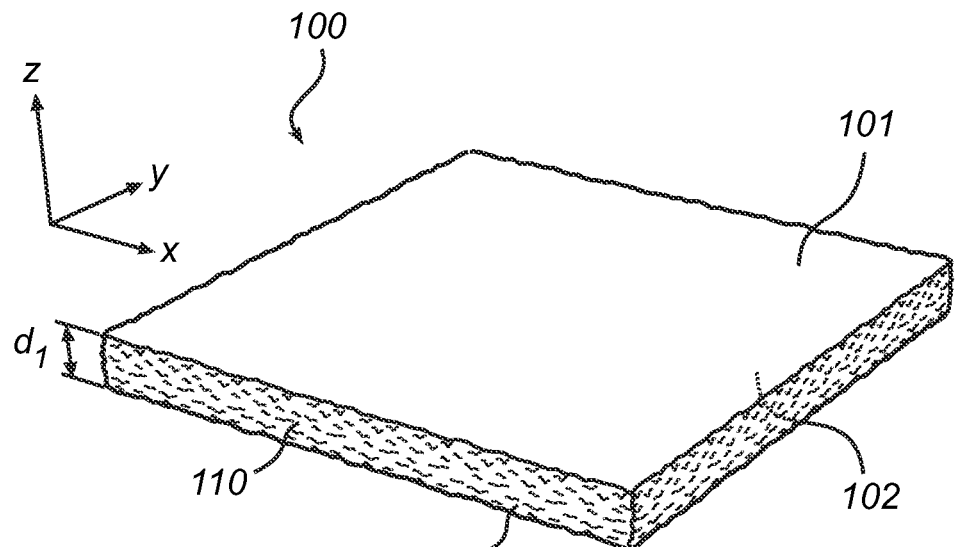
FIG. 1a) is a schematic perspective side view of a piece of thermal interface material, TIM, according the present invention before activation, and 1b) illustrates the same TIM as shown in FIG. 1a) when activated.
Figure 1B:
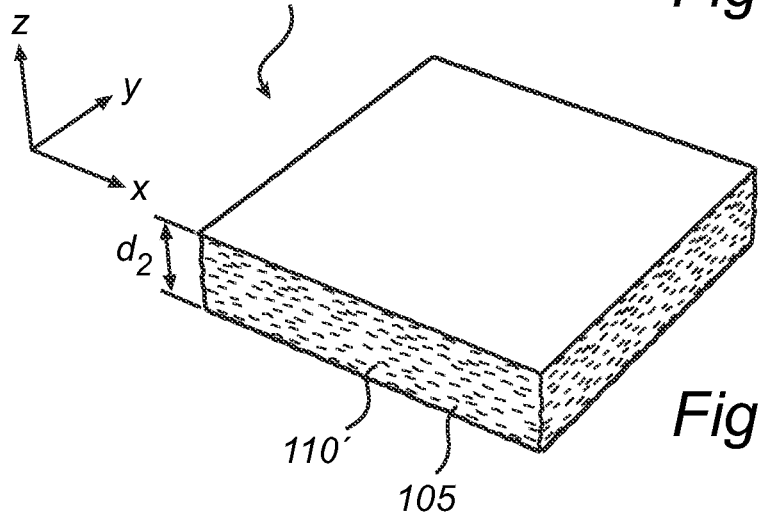

Referring now to FIG. 1a), which illustrates an embodiment 100 of a TIM according to the present invention, the TIM 100 comprises a TIM-layer 105, i.e. a substantially flat material structure with and upper surface 101 and a lower surface 102 having a thickness $d_1$ in the z-direction which is small compared to the extent of the physical dimensions of the layer in the xy-plane. A shrinkage material 110 is distributed within the TIM layer 105. The shrinkage material 110 is in this exemplifying embodiment heat sensitive polymer shrinkage fibers added to the TIM layer 105 material during manufacturing thereof. The TIM layer 105 may be formed in a moulding process. The fibers are here randomly mixed in the TIM layer material 100. In an alternative embodiment, the fibers of heat shrinkage material 110 are prearranged in a mesh shape and pressed into the flexible substance of the TIM layer 105 to be fully enclosed by the TIM 100. FIG. 1b) illustrates the TIM 100 after activation of the heat sensitive polymer shrinkage fibers of the shrinkage material 110. When the TIM 100 in FIG. 1a) is exposed to heat the shrinkage fibers react to the heat by shortening, pulling TIM layer material from the boundaries of the TIM layer 105 inwards. The shrinkage behavior of the fibers has a dominant effect in the xy-direction due to the relatively small z-direction dimension of the TIM. This mechanism increases the height of the activated TIM 100' such that a new height $d_2$ is obtained for the heat activated TIM 100'.

The shrinkage material may be added to the TIM layer in the form of shrinkage material fibers, monomers, polymer compositions, or even as freestanding layer structures, as will be described herein under.

To optimize the influence of the shrinkage material in the TIM layer, and to facilitate increase in TIM layer height, the shrinkage material is in preferred embodiments arranged in a predetermined orientation within the TIM layer. Generally, an orientation direction excluding the thickness direction (z-direction) of the TIM is preferred.

Figure 2A:
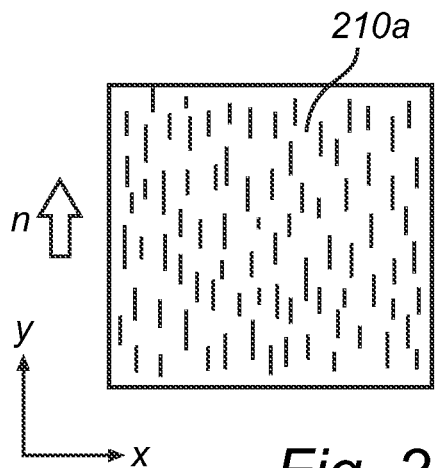
FIGS. 2a)-g) are schematic illustrations of directions and patterns of the alignment of the shrinkage material in the TIM according to embodiments of the present invention.
Figure 2B:
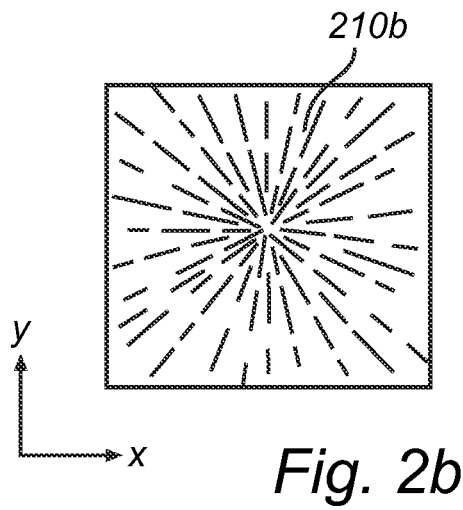
Figure 2C:
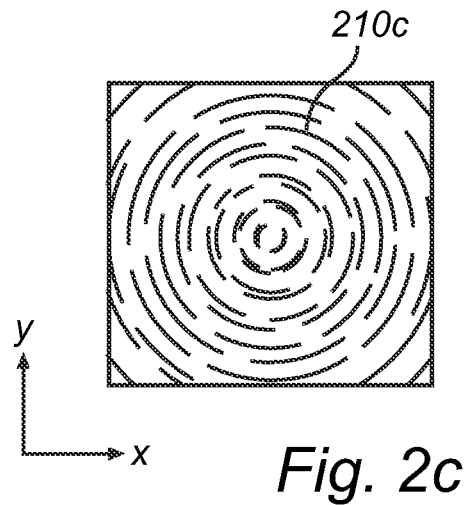
Figure 2D:
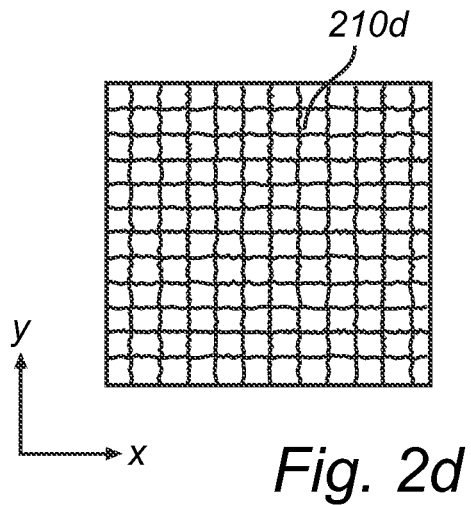
Figure 2E:
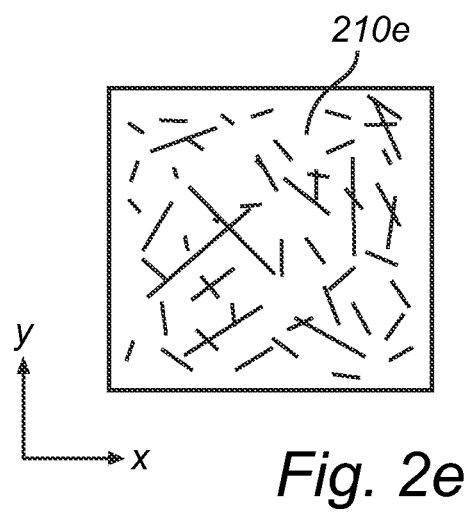
Figure 2F:
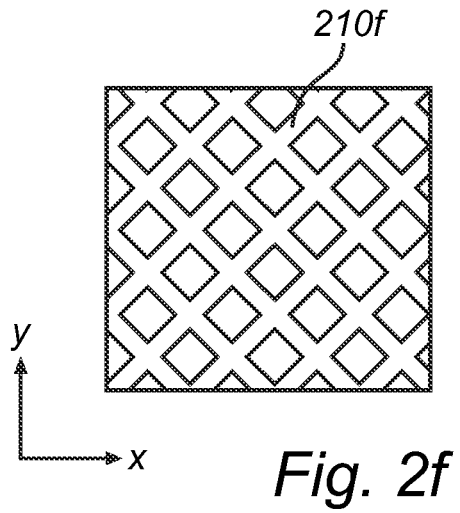

In FIGS. 2a)-2g), some preferred orientations of shrinkage material 210a-e'' within the xy-plane of a TIM are illustrated: FIG. 2a) shows shrinkage material 210a oriented in a single direction n, FIG. 2b) shows shrinkage material 210b in a radial orientation, FIG. 2c) shows shrinkage material 210c in a circular orientation, FIG. 2d) shows shrinkage material 210d in a cross-linked mesh-like structure, FIG. 2e) shows shrinkage material 210e comprising randomly oriented long and short fibers/polymers, FIG. 2f) shows shrinkage material 210f in a polymer layer structure with a mesh structure, and FIG. 2g) illustrates how the shrinkage material is provided as an expanded polymer matrix, here formed by using a cut shrinkage foil 210e', which is stretched to form an expanded shrinkage foil 210e''. The expanded polymer matrix approach will be separately discussed herein under.

According to the inventive concept different mechanisms to provide the shrinkage material can be utilized. Firstly, for instance if the shrinkage material comprises many monomers, then when the shrinkage material is activated the monomers polymerize. This increases the density of the material as the monomers become bonded together, therefore taking up less space. Accordingly, the volume of the heat shrinkage material shrinks, resulting in the increase in height of the TIM.

The shrinking can also be expansion-based. According to an embodiment (not shown), the TIM material itself is arranged to provide the shrinkage material. This process involves producing the TIM as normal, then heating it to allow stretching of the TIM and then mechanically stretching the TIM. In this expanded state, the TIM is finally rapidly cooled. Later, when heated, i.e. activated, the polymers within the TIM relax back to the un-expanded size, while the TIM keeps its original volume with an expanding effect as a result. According to embodiments that utilize an expanded polymer matrix, the expanded polymer matrix is manufactured as a layer within the TIM, as explained below, which TIM is subsequently heated, stretched, and rapidly cooled. Optionally, the expanded polymer matrix is manufactured, heated, stretched, and rapidly cooled before being added to the TIM layer. Optionally the heat shrinkage material is stretched at room temperature and locked mechanically, e.g. by laminating the stretched heat shrinkage material to a TIM layer to keep its expansion until it should be activated.

Referring now to FIG. 3, as previously mentioned the present inventive concept discloses a multi layer TIM. In general a multi layer TIM according to the present invention refers to a TIM formed by alternate stacking of least one shrinkage material layer and at least one TIM sub layer, the latter being for instance a thermal pad. FIGS. 3a)-3d) illustrate TIMs 310 and 311 comprising one shrinkage material layer 301 arranged together with one 302 or two TIM sub layers 302, 303.

In FIG. 3a) the shrinkage material 301 is laminated between the TIM sub layers 302, 303 allowing them both to have a direct (bonding) contact with the shrinkage layer. In FIG. 3b) the multilayer TIM 311 comprises one TIM sub layer 302 onto which a shrinkage layer 301 is arranged. The shrinkage layer 301 may be arranged as a mesh. A two layer TIM is applicable for instance for simpler assemblies and when thinner materials are applicable or desired for use as a thermal interface. This is advantageous from an economic perspective. The shrinkage material layer may further in different TIM arrangements but here illustrated with reference to a two layer TIM, be arranged as an open structure as illustrated in FIG. 3c) and FIG. 3g), or a closed structure as illustrated in FIG. 3d). For the open structure, as illustrated in more detail for the TIM 313 in FIG. 3g), the shrinkage material is arranged such that the shrinkage structure 314, which can be a mesh, oriented fibers, an expanded polymer matrix etc., has openings 315 arranged in the xy-plane of the TIM 313 to facilitate heat dissipation through the TIM 313 in the z-direction. For a closed structure, referring again to FIG. 3d), the heat shrinkage material 301' is substantially evenly distributed over substantially the whole xy-plane of the TIM 311'. The heat shrinkage material 301' is here a thin stretched shrinkage foil, where the thickness of the foil is preferably selected not to create a large obstruction in the heat path.

Figure 3E:
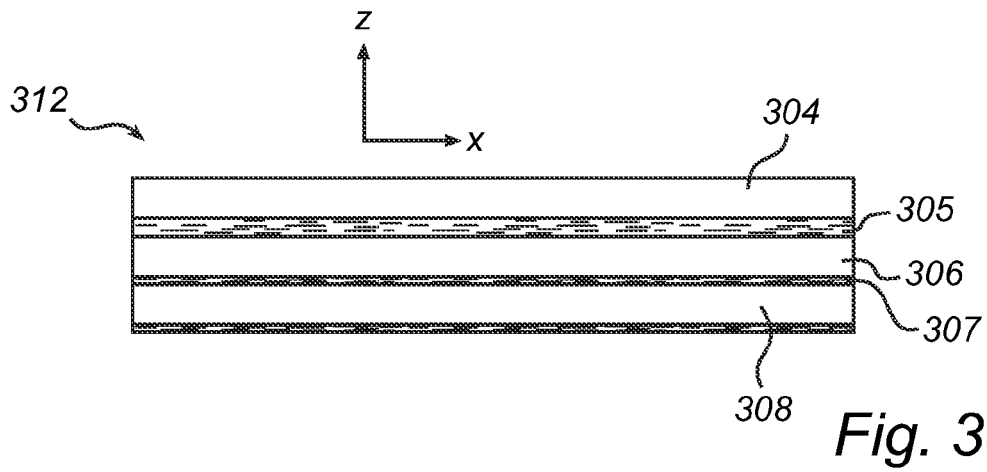
FIGS. 3a)-g) are schematic illustrations of different multilayer TIMs according to embodiments of the present invention.
Figure 3F:
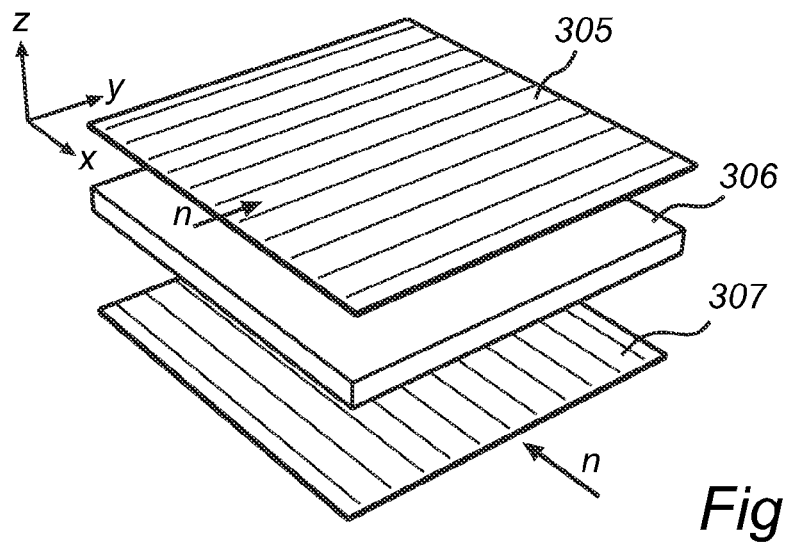
Figure 3G:
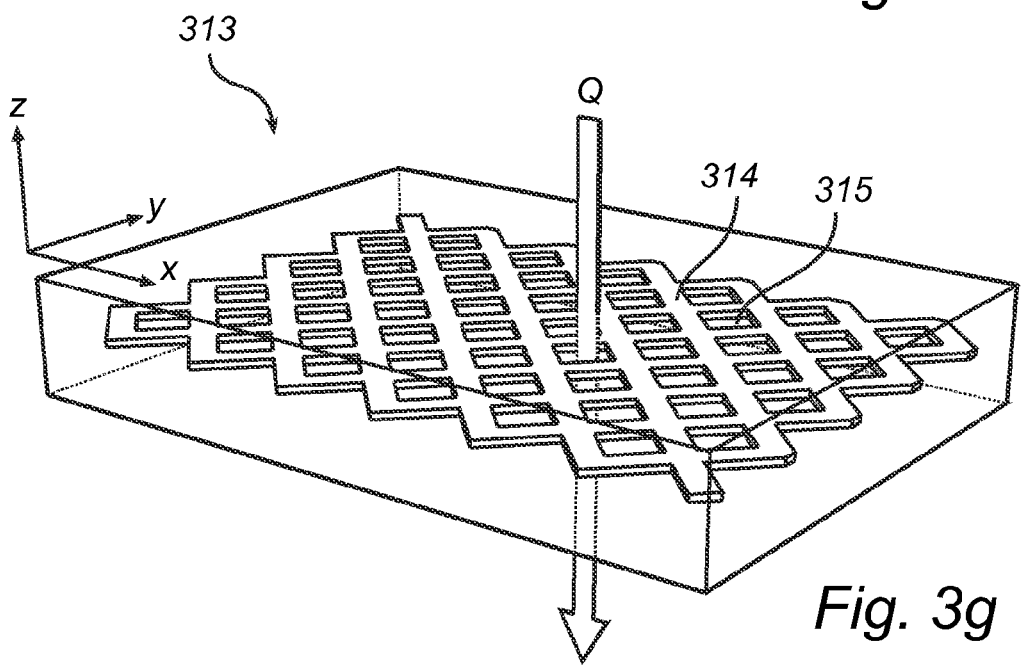

As illustrated in FIG. 3e) embodiments of the TIM may comprise multiple layers of shrinkage material. Here two shrinkage material layers, 305 and 307, are stacked between three TIM sub layers, 309, 306, and 308. The shrinkage material is preferably oriented within each shrinkage material layer. Different orientations can be applied for the different layers, as illustrated in FIG. 3f). Here it is schematically illustrated how the shrinkage material layer 305 and the shrinkage material layer 306 both are oriented in two different directions in the xy-plane. Optionally, different materials are selected for different shrinkage layers, and/or different TIM-layers depending on the specific application of the TIM.

FIG. 4 illustrates a thermal interface application employing a TIM 400 according to the present inventive concept. To provide the thermal interface, initially the not yet activated TIM 400 is arranged between a heat generating component 20, which comprises LEDs 21 arranged on a printed circuit board, PCB, 22, and a heat sink or heat spreader 30. A fixation means 25, here a screw or press fit/clinched pin, is used to define a position of the heat generating component 20 on the heat sink 30, and to define a maximum separation h between the heat generating component 20 and the heat sink 30. The TIM 400 is preferably placed with an oversized boundary between the PCB 22 and the heat sink 30. At the first use of the LEDs 21, the TIM 400 is exposed to heat passing through the PCB 22 and the shrinkage material in the TIM 400 is activated. As previously described, activation of the shrinkage material causes an increased thickness of the TIM, which here, due to the restricted distance h between the heat generating component 20 and the heat conducting element, i.e. here the heat sink 30, in turn increases the respective surface pressures of the TIMs first and second surfaces (101, and 102, see FIG. 1) against the heat generating component 20 and the heat sink 30. The shrinkage mechanism increases the TIM volume in the thermo-active region, resulting in the expanding TIM (z-direction) while maintaining a needed TIM material-density for effective heat dissipation. The increased TIM surface pressure onto the heat interface thereby improves the TIM performance.

Figure 4A:
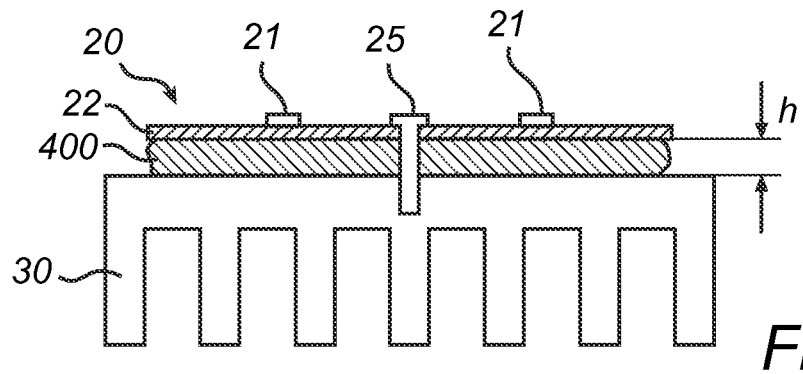
FIGS. 4a)-c) are schematic cross sectional views of a thermal interface in an electric assembly according to embodiments of the present invention when arranged between a heat generating component and a heat sink or heat spreader.
Figure 4B:
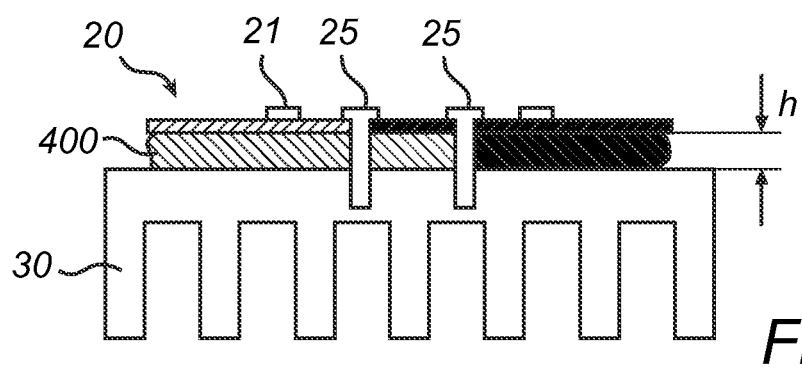
Figure 4C:
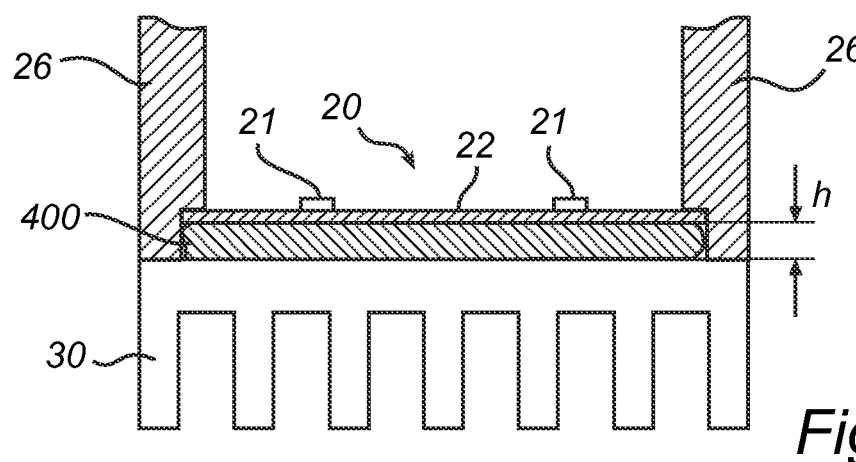

According to an embodiment of the thermal interface, as illustrated in FIG. 4b) multiple fixation means, here two screws 25, are utilized to provide a restricted maximum separation h between the heat generating component 20 and the heat sink 30. Further, other fixation means are applicable, e.g. a mechanical structure 26, as illustrated in FIG. 4c).

In an experimental set-up to show the improved thermal behavior of the present inventive concept (not shown), an embodiment of a thermal interface similar to the thermal interface as illustrated in FIG. 4a) was provided by utilizing a TIM structure similar to the TIM shown in FIG. 3a) as TIM 400. The used TIM comprises a layer of shrinkage material being a commercially available shrink tube material, which was cut open, perforated and laminated between two TIM layers, each being a GapPad 1450 thermal pad having a stated thickness of 20 Mills, which is approximately 0.5 mm, (Bergquist). The thermal pads were altered by removing the pink liner layer. The TIM was sandwiched between two aluminum plates which were separated with a fixed height difference. Thermocouples were placed on both sides of the TIM. Further, a power resistor was arranged on top of one of the aluminum plates. The assembly was placed with thermal grease on a fixed temperature cold plate (25° C.). In the experiment the temperature difference before and after activation of the shrinkage material (by means of an external heat source 120° C.) of the TIM was measured, the thermal resistance over the expanding TIM was derived, and the ratio of the temperature difference was derived after:before shrinkage activation, see Table 1. Table 1.

| Power input [W] | Temperature difference [° C.] | Thermal Resistance over TIM [K/W] | Ratio after:before shrinkage activation |
|---|---|---|---|
| 3.654 | 9.9 | 2.71 | before |
| 10.26 | 25.5 | 2.49 | before |
| 3.654 | 8.6 | 2.35 | after (87%) |
| 10.25 | 22.5 | 2.2 | after (88%) |

The rather rough experiment, which was far from optimized with respect to TIM material, shrinking material, thermal connections between upper and lower metal plates etc., illustrates that the present inventive concept provides a sufficiently improved thermal contact for the interface between the two mating metal plate surfaces. Further, after the experiment the sample was disassembled to inspect the status of the TIM, which showed shrinkage in a single direction in the xy-plane (as was expected since the shrinkage tube was designed to have a single shrinkage direction). In addition, no de-lamination of the TIM was observed.

The materials for the TIM layer, or sub layers, and its corresponding shrinkage material, as referred to above, are typically selected based on the specific application in which the TIM is utilized. In principle, as TIM layer material any suitable Thermal Pad Material is applicable. Today, there is a large number of commercially available Thermal Pad Materials. These materials are typically a compound of a silicone or acrylic carriers with so called fillers. The silicone or acrylic carriers facilitate good wetting of mating surfaces. The fillers are typically ceramic or metallic particles, provided to facilitate thermal conductivity of the Thermal Pad Material. There is a very wide range of Thermal Pad Materials available.

According to the present inventive concept, the material of the TIM layer or sub layers is typically selected to provide a good mechanical connection with the shrinkage material, which is important to keep the structural integrity of the TIM in the assembly after activation of the shrinkage material. For instance Thermal Pad Materials that are flexible to some extend are applicable as TIM matrix or sub layer material. Examples of these Thermal Pad Materials are the Gap Pad Series (Bergquist Company), Sil Pad Series (Bergquist Company), T-Flex Series (Laird Technologies), etc.

In embodiments of the TIM, preferably a more soft Thermal Pad Material is selected as the TIM matrix or sub layers, to allow for easier deformation of the TIM in the shrinkage process (in the x-, and y-direction), while expanding in the perpendicular direction (z).

Heat shrinkage material applicable for the present inventive TIM may comprise heat sensitive polymer shrinkage fibers comparable to the polymers applied in shrink tubes, for instance: Polytetrafluoroethylene, PTFE (fluoropolymer), fluoroelastomers like Viton®, Polyvinylidene fluoride, PVDF, Fluorinated ethylene propylene, FEP, Elastomeric, Silicone rubber, polyolefin tubes, PVC, PE thermo shrinkage film, Shrinkage fabric and more (shrink film can also be made of oriented polystyrene, OPS, oriented polyethylene, OPE, oriented polypropylene, OPP, and oriented polyesters). These materials are commercially available and generally well suited for use in thermal management systems. They are flexible and fast-shrinking, and manufactured in a wide range of colors.

Optionally, heat shrink polymer materials which are possible to cross-link after application and optionally after being arranged in a preferred orientation are used. Depending on the material, cross-linking can be done through the use of electron beams, peroxides, or moisture. For instance when using heat shrink polyethylene (cross-linked low density polyethylene) cross-linking can be performed by means of electron irradiation. The cross-linking advantageously increases mechanical integrity of the TIM, i.e. it helps to make the TIM maintain its shape, both before and after shrinking.

In the exemplifying embodiments herein and throughout the description, the use of the term shrinkage material typically refers to thermal shrinkage materials, which are shrinkage polymer materials in which the shrinking is activated by means of heat. Shrinkage in a polymer material varies not only with the polymer used but also with various additives and fillers that have been blended with the polymer. Further, it should be noted, as is appreciated by a skilled person, that other types of shrinkage materials with some other activation mechanism, e.g. solvent activation, time activation, radiation activation, and ultrasonic activation, for the shrinkage material are applicable for the present inventive concept, and is thus considered to fall within the scope of this application.

The person skilled in the art realizes that the present invention by no means is limited to the embodiments described above. On the contrary, many modifications and variations are possible within the scope of the appended claims.

The invention claimed is:

1. A thermal interface material, TIM comprising:
a TIM layer comprising
an activable shrinkage material that shrinks upon activation of the shrinkage material;
wherein said shrinkage material is distributed in said TIM layer such that upon activation of said shrinkage material the thickness of said TIM layer is increased.

2. The TIM according to claim 1, wherein said shrinkage material is provided in an oriented direction.

3. The TIM according to claim 2, wherein said oriented direction is selected within the TIM layer xy-plane.

4. The TIM according to claim 1, wherein said TIM layer is a multilayer TIM comprising alternate TIM sub layers and shrinkage material layers.

5. The TIM according to claim 1, wherein said shrinkage material comprises monomers, and wherein said activation of said shrinkage material causes said monomers to polymerize.

6. The TIM according to claim 1, wherein said shrinkage material is an expanded polymer matrix, and wherein said activation of the shrinkage material causes said expanded polymer matrix to relax back to an un-expanded state.

7. The TIM according to claim 1, wherein said shrinkage material is heat activated.

8. The thermal interface comprising a TIM according to claim 1, wherein said TIM before activation of said shrinkage material is sandwiched between a heat generating component and a heat conducting element, wherein the distance between the heat generating component and the heat conducting element is restricted.

9. A method for providing a Thermal Interface Material (TIM) comprising:
providing a TIM layer;
providing in said TIM layer an activable shrinkage material arranged in such a way that upon activation of said shrinkage material the thickness of said TIM layer is increased.

10. The method according to claim 9, further comprising:
arranging said shrinkage material in an oriented direction.

11. The method according to claim 9, wherein said shrinkage material is a monomer based material, wherein said activation of said shrinkage material causes monomers of said monomer based material to polymerize.

12. The method according to claim 9, wherein said shrinkage material is a polymer matrix and wherein said step of orienting said shrinkage material comprises:
mechanically stretching said polymer matrix in a direction corresponding to the TIM layer xy-plane; and subsequently
locking said stretched polymer matrix, thereby providing an expanded polymer matrix.

13. The method according to claim 12, further comprising providing a multilayer TIM using alternate stacking of at least one TIM sub layer and at least one shrinkage material layer.

14. The method according to claim 9, further comprising
arranging said TIM between a heat generating component and a heat conducting substrate, wherein the distance between the heat generating component and the heat conducting substrate is restricted.

15. A light emitting device comprising:
a printed circuit board;
a light source, comprising a light emitting diode, arranged on the printed circuit board; and
a heat sink,
wherein the light emitting device further comprises the TIM as claimed in claim 1, wherein said TIM before activation of said shrinkage material is sandwiched between the printed circuit board and the heat sink and wherein the distance between the printed circuit board and the heat sink is restricted.

16. The method according to claim 9, wherein the activable shrinkage material shrinks upon activation of the shrinkage materials.

* * * * *